(12) United States Patent
Dai

(10) Patent No.: US 10,431,178 B2
(45) Date of Patent: Oct. 1, 2019

(54) GOA DRIVING CIRCUIT

(71) Applicant: Wuhan China Star Optoelectronics Technology Co., Ltd., Wuhan, Hubei (CN)

(72) Inventor: Ronglei Dai, Guangdong (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 21 days.

(21) Appl. No.: 15/969,246

(22) Filed: May 2, 2018

(65) Prior Publication Data
US 2019/0130859 A1 May 2, 2019

Related U.S. Application Data

(63) Continuation of application No. PCT/CN2018/071663, filed on Jan. 5, 2018.

(30) Foreign Application Priority Data

Oct. 31, 2017 (CN) .......................... 2017 1 1069576

(51) Int. Cl.
*G09G 3/36* (2006.01)
*G11C 19/28* (2006.01)

(52) U.S. Cl.
CPC ............ *G09G 3/3677* (2013.01); *G11C 19/28* (2013.01); *G09G 2300/0408* (2013.01); *G09G 2310/0286* (2013.01); *G09G 2310/063* (2013.01); *G09G 2320/0257* (2013.01); *G09G 2330/027* (2013.01)

(58) Field of Classification Search
CPC .............. G09G 3/3674; G09G 3/3677; G09G 2300/0408; G09G 2310/0245; G09G 2310/0286; G09G 2310/061; G09G 2310/063; G09G 2320/0257; G09G 2330/027; G11C 19/28
See application file for complete search history.

(56) References Cited

U.S. PATENT DOCUMENTS

| | | | |
|---|---|---|---|
| 9,632,611 B1* | 4/2017 | Xiao | G06F 3/0412 |
| 9,898,989 B2* | 2/2018 | Xiao | G06F 3/0412 |
| 9,922,997 B2* | 3/2018 | Xiao | H01L 27/124 |
| 9,933,889 B2* | 4/2018 | Xiao | G06F 3/0416 |
| 9,959,830 B2* | 5/2018 | Xiao | G09G 3/3648 |
| 10,121,433 B2* | 11/2018 | Xiao | G09G 3/3648 |
| 2019/0130858 A1* | 5/2019 | Xiao | G09G 3/3677 |

FOREIGN PATENT DOCUMENTS

| | | |
|---|---|---|
| CN | 105206237 A | 12/2015 |
| WO | 2017117846 A1 | 7/2017 |

* cited by examiner

*Primary Examiner* — Patrick O Neill
(74) *Attorney, Agent, or Firm* — Hauptman Ham, LLP

(57) ABSTRACT

The disclosure provides a GOA driving circuit comprising a plurality of GOA driving unit stages. When power is turned off, the pull-up control module controls the pull-up output module to stop outputting the clock signal, the pull-down control module controls the pull-down output module to stop outputting the low potential signal, the first global control module outputs the high potential signal, the reset module stops outputting the reset signal, and the second global control module stops outputting the low potential signal. Generation of the residual image on the liquid crystal screen is prevented when power is turned off.

10 Claims, 3 Drawing Sheets

GOA DRIVING CIRCUIT

RELATED APPLICATIONS

This application is a continuation application of PCT Patent Application No. PCT/CN2018/071663, filed Jan. 5, 2018, which claims the priority benefit of Chinese Patent Application No. 201711069576.3, filed Oct. 31, 2017, which is herein incorporated by reference in its entirety.

FIELD OF THE DISCLOSURE

The disclosure relates to an electronic circuit field, and more particularly to a gate driver on array (GOA) driving circuit.

BACKGROUND

Thin film transistor liquid crystal display (TFT-LCD) has now become the mainstream display on the market. The basic principle is that the liquid crystal in the display is driven to deflect by the voltage and the direction of light is changed so that different color is displayed in the display. A Gate Driver On Array (GOA) circuit is a technology that integrates a gate driving circuit on an array substrate of a liquid crystal display panel to scan the gate lines in sequence. In the case of abnormal power off, the LCD screen remains residual image because charges are remained in the pixel capacitances. In the existed technologies, there is a lack of effective mechanisms to prevent this phenomenon.

SUMMARY

The disclosure provides a gate driving circuit to prevent the LCD screen from remaining residual image when power is turned off abnormally, so that enjoying watching is improved.

In a first aspect, the present disclosure provides a GOA driving circuit, comprising: a plurality of GOA driving unit stages; wherein, a nth GOA driving unit stage comprises: a pull-up control module, a pull-up output module, a pull-down control module, a pull-down output module, a first global control module, a reset module and a second global control module;

the pull-up control module is configured to generate a first control signal when power is turned off;
the pull-up output module is configured to stop outputting a clock signal to an output terminal of the nth GOA driving unit stage under control of the first control signal;
the pull-down control module is configured to generate a second control signal when power is turned off;
the pull-down output module is configured to stop outputting a low potential signal to the output terminal of the nth GOA driving unit stage under control of the second control signal;
the first global control module is configured to output a high potential signal to the output terminal of the nth GOA driving unit stage when power is turned off;
the reset module is configured to stop outputting a reset signal to an output terminal of the pull-down control module when power is turned off;
the second global control module is configured to stop outputting output the low potential signal to the output terminal of the nth GOA driving unit stage when power is turned off.

In some possible embodiments combined with the first aspect, the pull-up control module comprises a first thin film transistor (TFT), a second TFT, a fifth TFT and a seventh TFT;
wherein, a gate terminal of the first TFT receives an output signal of a (n−2)th GOA driving unit stage, a source terminal of the first TFT receives a forward scan signal, and a drain terminal of the first TFT is electrically connected to a source terminal of the seventh TFT; a gate terminal of the second TFT receives an output signal of a (n+2)th GOA driving unit stage, a source terminal of the second TFT receives a reverse scan signal, and a drain terminal of the second TFT is electrically connected to the source terminal of the seventh TFT; a gate terminal of the fifth TFT is electrically connected to the output terminal of the pull-down control module, a source terminal of the fifth TFT receives the low potential signal, and a drain terminal of the fifth TFT is electrically connected to the source terminal of the seventh TFT; a gate terminal of the seventh TFT receives the high potential signal, and a drain terminal of the seventh TFT is electrically connected to an output terminal of the pull-up control module; wherein, the pull-up control module is configured to generate the first control signal, which is the low potential signal, to turn off the pull-up output module when the power is turned off.

In some possible embodiments combined with the first aspect, the pull-up output module comprises: a tenth TFT;
wherein, a gate of the tenth TFT is electrically connected to the output terminal of the pull-up control module, a source terminal of the tenth TFT receives a nth stage clock signal, and a drain terminal of the tenth TFT is electrically connected to the output terminal of the nth GOA driving unit stage; wherein, the pull-up output module is turned off by the low potential signal generated from the pull-up control module when power is turned off, so that the low potential signal is not output to the output terminal of the nth GOA driving unit stage from the pull-up output module.

In some possible embodiments combined with the first aspect, the pull-down control module comprises: a third TFT, a fourth TFT, a sixth TFT, an eighth TFT, a ninth TFT and a twelfth TFT;
wherein, a gate terminal and a source terminal of the third TFT receive a (n+1)th stage clock signal, and a drain terminal of the third TFT is electrically connected to a source terminal of the eighth TFT; a source terminal and a gate terminal of the fourth TFT receives a (n−1)th stage clock signal, and a drain terminal of the fourth TFT is electrically connected to a source terminal of the ninth TFT; a gate terminal of the sixth TFT is electrically connected to the source terminal of the seventh TFT, a source terminal of the sixth TFT receives the low potential signal, and a drain terminal of the sixth TFT is electrically connected to the output terminal of the pull-down control module; a gate terminal of the eighth TFT receives the forward scan signal, and a drain terminal of the eighth TFT is electrically connected to the output terminal of the pull-down control module; a gate terminal of the ninth TFT receives the reverse scan signal, and a drain terminal of the ninth TFT is electrically connected to the output terminal of the pull-down control module; a gate terminal of the twelfth TFT receives a first global control signal, a source terminal of the twelfth TFT receives the low potential signal, and a drain terminal of the twelfth TFT is electrically connected to the output terminal of the pull-down control module; wherein, the pull-down control module is configured to generate the second control signal, which is the low potential signal, to turn off the pull-down output module when the power is turned off.

In some possible embodiments combined with the first aspect, the pull-down output module comprises: an eleventh TFT;

wherein, a gate terminal of the eleventh TFT is electrically connected to the output terminal of the pull-down control module, a source terminal of the eleventh TFT receives the low potential signal, and a drain terminal of the eleventh TFT is electrically connected to the output terminal of the nth GOA driving unit stage; wherein, the pull-down output module is turned off by the low potential signal generated from the pull-down control module when power is turned off, so that the low potential signal is not output to the output terminal of the nth GOA driving unit stage from the pull-down output module.

In some possible embodiments combined with the first aspect, wherein the first global control module comprises: a fourteenth TFT;

wherein, a gate terminal and a source terminal of the fourteenth TFT receive the first global control signal, and a drain terminal of the fourteenth TFT is electrically connected to the output terminal of the nth GOA driving unit stage; wherein, the first global control module outputs the high potential signal to the output terminal of the nth GOA driving unit stage when power is turned off.

In some possible embodiments combined with the first aspect, the reset module comprises: a thirteenth TFT;

wherein, a gate terminal and a source terminal of the thirteenth TFT receives the reset signal, and a drain terminal of the thirteenth TFT is electrically connected to the output terminal of the pull-down control module; wherein, the reset module is configured to control to output the low potential signal from the output terminal of the pull-down control module.

In some possible embodiments combined with the first aspect, the second global control module comprises: a fifteenth TFT;

wherein, a gate terminal of the fifteenth TFT receives a second global control signal, a source terminal of the fifteenth TFT receives the low potential signal, and a drain terminal of the fifteenth TFT is electrically connected to the output terminal of the nth GOA driving unit stage; wherein, the second global control module controls to output the high potential signal from the output terminal of the nth GOA driving unit stage when power is turned off.

In some possible embodiments combined with the first aspect, the nth GOA driving unit stage further comprises a first capacitor and a second capacitor;

wherein, a first terminal of the first capacitor is electrically connected to the source terminal of the seventh TFT, and a second terminal of the first capacitor receives the low potential signal; a first terminal of the second capacitor is electrically connected to the output terminal of the pull-down control module, and a second terminal of the second capacitor receives the low potential signal; wherein, when power is turned off, the first capacitor is configured to keep a potential at the source terminal of the seventh TFT and the second capacitor is configured to keep a potential at the output terminal of the pull-down control module.

In some possible embodiments combined with the first aspect, in a first GOA driving unit stage and a second GOA driving unit, the gate terminal of the first TFT receives a starting signal; and, in a last GOA driving unit stage and a penultimate GOA driving unit stage, the gate terminal of the second TFT receives the starting signal; wherein the starting signal is the high potential signal.

It can be found that each GOA driving unit stage of the GOA driving circuit in the embodiments of the present disclosure comprises a pull-up control module, a pull-down control module, a pull-up output module, a pull-down output module, a first global control module, a second global control module and a reset module. When power is turned off, the pull-up control module generates the low potential signal to turn off the pull-up output module so that the output of the pull-up output module does not affect the output terminal of the GOA driving unit; the pull-down control module and the reset module generate the low potential signal to turn off the pull-down output module so that the output of the pull-down output module does not affect the output terminal of the GOA driving unit; the first global control module and the second global control module controls to output the high potential signal. By performing the embodiments of the present disclosure, image on the liquid crystal screen can be quickly cleaned when power of the liquid crystal screen is suddenly turned-off, residual image is prevented from being remained on the screen, and visual experience is benefit therefrom.

BRIEF DESCRIPTION OF THE DRAWINGS

In order to make the descriptions of the technique solutions of the embodiments of the present invention or the existed techniques, the drawings necessary for describing the embodiments or the existed techniques are briefly introduced below. Obviously, the drawings described below are only some embodiments of the present invention, and, for those with ordinary skill in this field, other drawings can be obtained from the drawings described below without creative efforts.

DETAILED DESCRIPTION OF PREFERRED EMBODIMENTS

Figure 1:
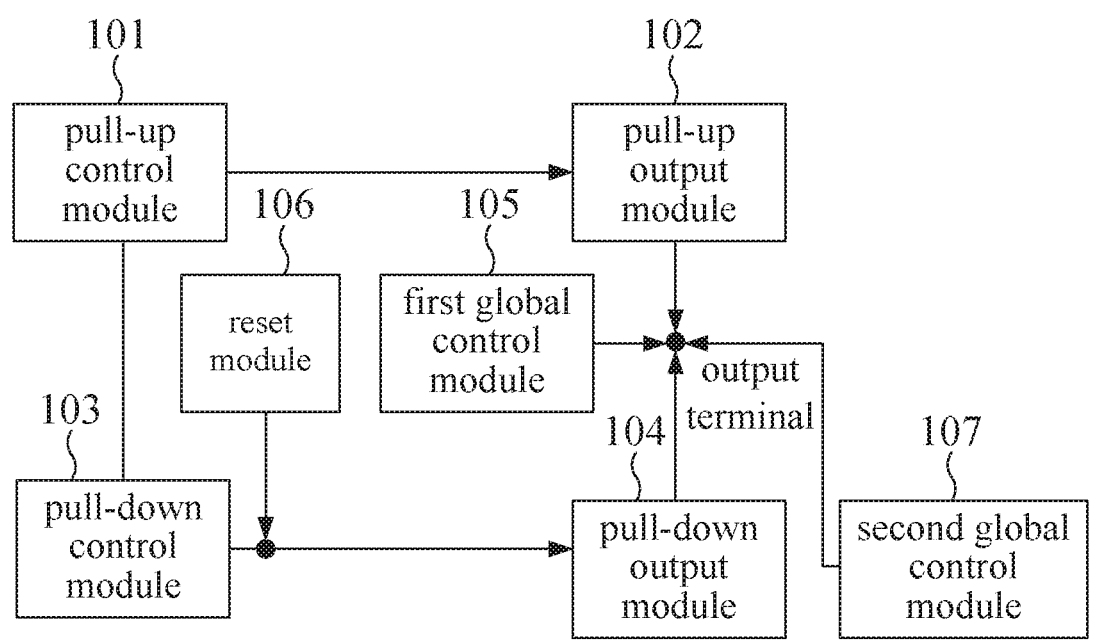
FIG. 1 is a function-module schematic diagram of the GOA driving unit according to the disclosure.

The technical solutions in the embodiments of the present disclosure will be described clearly and completely hereinafter with reference to the accompanying drawings in the embodiments of the present disclosure. Apparently, the described embodiments are merely some but not all embodiments of the present disclosure. All other embodiments obtained by persons with ordinary skill in the art based on the embodiments of the present invention without creative efforts shall fall within the protection scope of the present invention.

It is noted that, the terms used herein are only for illustrating concrete embodiments rather than limiting the exemplary embodiments. Unless otherwise indicated in the content, singular forms "a" and "an" also include plural. Moreover, the term "and/or" means and includes any or all possible combinations of one or more of the associated listed items.

The terms "comprising" and "including", as well as any variations thereof in the description and claims of the present disclosure and the above drawings, are intended to cover the inclusion of non-exclusive inclusions. For example, comprising a process, method, system, product, or device that incorporates a series of steps or units is not limited to the steps or units listed but may optionally further include steps or units not listed or may optionally further include other steps or units inherent to these processes, methods, products, or devices.

It is noted that, the embodiments of the present disclosure are described in detail below. Examples of the embodiments are shown in the accompanying drawings, where the same or similar reference numbers indicate the same or similar elements or elements having the same or similar functions from beginning to end. The embodiments described below with reference to the accompanying drawings are exemplary only to explain the present invention and should not be construed as limiting the present invention.

The following disclosure provides many different embodiments or examples for implementing different structures of the present invention. In order to simplify the disclosure of the present invention, the specific examples of the components and arrangements are described below. Of course, they are merely examples and are not intended to limit the present invention. In addition, the present disclosure may repeat reference numerals and/or letters in various examples. This repetition is for the purpose of simplification and clarity and does not by itself indicate the relationship between the various embodiments and/or arrangements discussed.

In the description of the present disclosure, it should be noted that the terms "mounted", "connect with", "connect to" and "connect" should be broadly understood unless otherwise specified and limited. For example, they may be mechanical connections or electrical connections, or may be the intercommunication between the two components. The intercommunication may be direct connection or indirect connection through an intermediary medium. For those skilled in the art, the specific meanings of the above terms may be understood according to specific situations.

Reference herein to "embodiment" means that a particular feature, structure, or characteristic described in connection with the embodiment may be included in at least one embodiment of the invention. The appearances of the phrase in various places in the specification are not necessarily all referring to the same embodiment, nor are separate or alternative embodiments mutually exclusive of other embodiments. As obviously or inherently understood by one with ordinary skill in the art, the embodiments described herein may be combined with other embodiments.

Please refer to FIG. 1, FIG. 1 is a function-module schematic diagram of the GOA driving unit according to the disclosure. As shown in FIG. 1, the GOA driving unit of the embodiment in the present disclosure comprises the pull-up control module 101, the pull-up output module 102, the pull-down control module 103, the pull-down output module 104, the first global control module 105 the reset module 106 and the second global control module 107.

In one embodiment, the pull-up control module 101 is electrically connected to the pull-down control module 103 and the pull-up output module 102, the pull-up output module 102 is electrically connected to the pull-down output module 104, the first global control module 105 and the second global control module 107, the pull-down control module 103 is electrically connected to the pull-down output module 104 and the reset module 106, the pull-down output module 104 is electrically connected to the first global control module 105 and the second global control module 107, and the first global control module 105 is electrically connected to the second global control module.

The pull-up control module is configured to generate a first control signal when power is turned off; the pull-up output module is configured to stop outputting a clock signal to an output terminal of the nth GOA driving unit stage under control of the first control signal; the pull-down control module is configured to generate a second control signal when power is turned off; the pull-down output module is configured to stop outputting a low potential signal to the output terminal of the nth GOA driving unit stage under control of the second control signal; the first global control module is configured to output a high potential signal to the output terminal of the nth GOA driving unit stage when power is turned off; the reset module is configured to stop outputting a reset signal to an output terminal of the pull-down control module when power is turned off; and the second global control module is configured to stop outputting the low potential signal to the output terminal of the nth GOA driving unit stage when power is turned off.

It can be found that each GOA driving unit stage of the GOA driving circuit in the embodiments of the present disclosure comprises a pull-up control module, a pull-down control module, a pull-up output module, a pull-down output module, a first global control module, a second global control module and a reset module. When power is turned off, the pull-up control module generates the low potential signal to turn off the pull-up output module so that the output of the pull-up output module does not affect the output terminal of the GOA driving unit; the pull-down control module and the reset module generate the low potential signal to turn off the pull-down output module so that the output of the pull-down output module does not affect the output terminal of the GOA driving unit; the first global control module and the second global control module controls to output the high potential signal. By performing the embodiments of the present disclosure, image on the liquid crystal screen can be quickly cleaned when power of the liquid crystal screen is suddenly turned-off, residual image is prevented from being remained on the screen, and visual experience is benefit therefrom.

Figure 2:
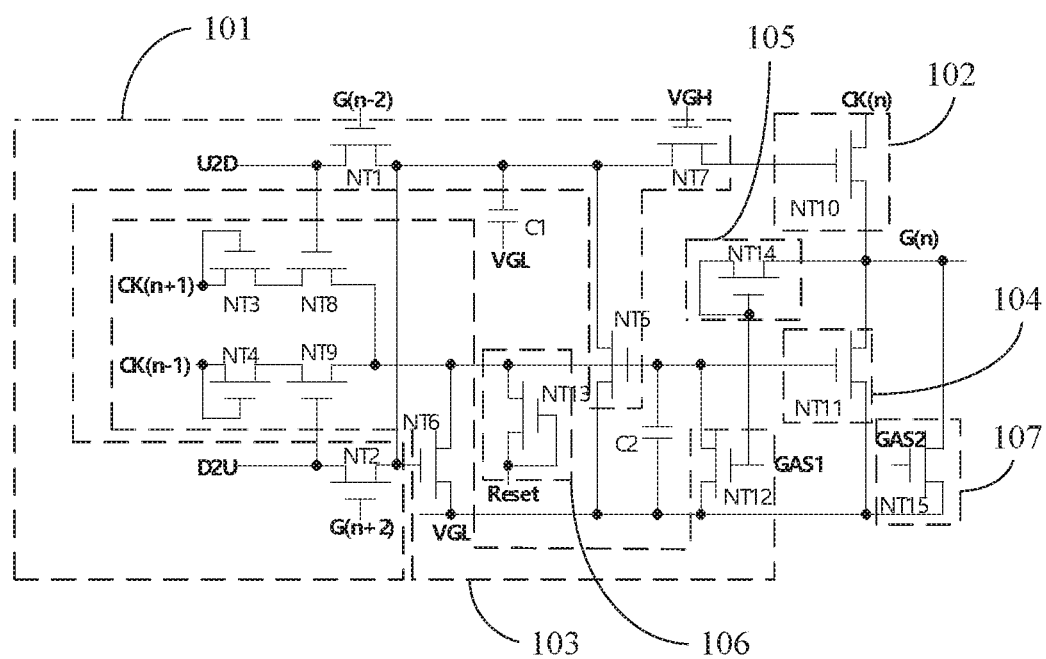
FIG. 2 is a circuit diagram of the GOA driving unit according to the disclosure.

Referring to FIG. 2, FIG. 2 is a circuit diagram of the GOA driving unit according to the second embodiment in the disclosure.

Each circuit module is described in detail as follows.

As shown in FIG. 2, the reference numeral 101 indicates the diagram showing connections of the pull-up control module. The pull-up control module 101 comprises the first thin film transistor (TFT) NT1, the second TFT NT2, the fifth TFT NT5 and the seventh TFT NT7.

In the embodiment, a gate terminal of the first TFT NT1 receives an output signal G(n−2) of a (n−2)th GOA driving unit stage, a source terminal of the first TFT NT1 receives a forward scan signal U2D, and a drain terminal of the first TFT NT1 is electrically connected to a source terminal of the seventh TFT NT7. A gate terminal of the second TFT NT2 receives an output signal G(n+2) of a (n+2)th GOA driving unit stage, a source terminal of the second TFT NT2 receives a reverse scan signal D2U, and a drain terminal of the second TFT NT2 is electrically connected to the source terminal of the seventh TFT NT7. A gate terminal of the fifth TFT NT5 is electrically connected to the output terminal of the pull-down control module 103, a source terminal of the fifth TFT NT5 receives the low potential signal VGL, and a drain terminal of the fifth TFT NT5 is electrically connected to the source terminal of the seventh TFT NT7. A gate terminal of the seventh TFT NT7 receives the high potential signal VGH, and a drain terminal of the seventh TFT NT7 is electrically connected to an output terminal of the pull-up control module 101. Wherein, the pull-up control module is configured to generate the first control signal, which is the low potential signal, to turn off the pull-up output module when the power is turned off.

Specifically, when power is turned off, the forward scan signal U2D is turned into the low potential signal and the output signal G(n−2) of the (n−2)th GOA driving unit is the high potential signal, so that the first TFT NT1 is controlled to turn on and the drain terminal of the first TFT NT1 is at low potential thereby. The reverse scan signal D2U is turned into the low potential signal and the output signal G(n+2) of the (n+2)th GOA driving unit is the high potential signal, so that the second TFT NT2 is controlled to turn on and the drain terminal of the second TFT NT2 is at low potential thereby. Because the gate terminal of the fifth TFT NT5 is electrically connected to the output terminal of the pull-down control module 103 which is at low potential as described below, the fifth TFT NT5 is turned off. The gate terminal of the seventh TFT NT7 receives the high potential signal and is turned on. Because the source terminal of the seventh TFT NT7 receives the low potential signal transmitted from the first TFT NT1 and the second TFT NT2, the drain terminal of the seventh TFT NT7 outputs the low potential signal so that the output of the pull-up control circuit is the low potential signal.

As shown in FIG. 2, the reference numeral 102 indicates the diagram showing connections of the pull-up output module. The pull-up output module 102 comprises the tenth TFT NT10.

In the embodiment, a gate of the tenth TFT NT10 is electrically connected to the output terminal of the pull-up control module 101, a source terminal of the tenth TFT NT10 receives a nth stage clock signal CK(n), and a drain terminal of the tenth TFT NT10 is electrically connected to the output terminal G(n) of the nth GOA driving unit stage. Wherein, the pull-up output module is turned off by the low potential signal generated from the pull-up control module when power is turned off, so that the low potential signal is not output to the output terminal of the nth GOA driving unit stage from the pull-up output module.

Specifically, when power is turned off, the nth stage clock signal CK(n) is turned into the low potential signal. Because the gate terminal of the tenth TFT NT10 is electrically connected to the output terminal of the pull-up control module 101 and the pull-up control module 101 outputs the low potential signal, the tenth TFT NT10 is turned off so that the low potential signal is not output to the output terminal G(n) of the nth GOA driving unit stage from the drain terminal of the tenth TFT NT10

As shown in FIG. 2, the reference numeral 103 indicates the diagram showing connections of the pull-down control module. The pull-down control module 103 comprises the third TFT NT3, the fourth TFT NT4, the sixth TFT NT6, the eighth TFT NT8, the ninth TFT NT9 and the twelfth TFT NT12.

In the embodiment, a gate terminal and a source terminal of the third TFT NT3 receive a (n+1)th stage clock signal CK(n+1), and a drain terminal of the third TFT NT3 is electrically connected to a source terminal of the eighth TFT NT8. A source terminal and a gate terminal of the fourth TFT NT4 receive a (n−1)th stage clock signal CK(n−1), and a drain terminal of the fourth TFT NT4 is electrically connected to a source terminal of the ninth TFT NT9. A gate terminal of the sixth TFT NT6 is electrically connected to the source terminal of the seventh TFT NT7, a source terminal of the sixth TFT NT6 receives the low potential signal VGL, and a drain terminal of the sixth TFT NT6 is electrically connected to the output terminal of the pull-down control module 103. A gate terminal of the eighth TFT NT8 receives the forward scan signal U2D, and a drain terminal of the eighth TFT NT8 is electrically connected to the output terminal of the pull-down control module 103. A gate terminal of the ninth TFT NT9 receives the reverse scan signal D2U, and a drain terminal of the ninth TFT is electrically connected to the output terminal of the pull-down control module 103. A gate terminal of the twelfth TFT NT12 receives a first global control signal GAS1, a source terminal of the twelfth TFT NT12 receives the low potential signal VGL, and a drain terminal of the twelfth TFT NT12 is electrically connected to the output terminal of the pull-down control module 103. Wherein, the pull-down control module is configured to generate the second control signal, which is the low potential signal, to turn off the pull-down output module when the power is turned off.

Specifically, when power is turned off, the (n+1)th stage clock signal CK(n+1) is turned into the low potential signal so that the third TFT NT3 is turned off, the forward scan signal U2D is turned into the low potential signal so that the eighth TFT NT8 is turned off, the (n−1)th stage clock signal CK(n−1) is turned into low potential signal so that the fourth TFT NT4 is turned off, and the reverse scan signal D2U is turned into low potential signal so that the ninth TFT NT9 is turned off. Because the gate terminal of the sixth TFT NT6 is electrically connected to the drain terminal of the second TFT NT2 and the drain terminal of the second TFT NT2 is at low potential, the sixth TFT NT6 is turned off. Because the gate terminal of the twelfth TFT NT12 receives the first global control signal GAS1 and the first global control signal GAS1 is at high potential, the twelfth TFT NT12 is turned on. Because the source of the twelfth TFT NT12 receives the low potential signal, the drain terminal of the twelfth TFT NT12 outputs the low potential signal to the output terminal of the pull-down control module.

As shown in FIG. 2, the reference numeral 104 indicates the diagram showing connections of the pull-down output module. The pull-down output module 104 comprises the eleventh TFT NT11.

In the embodiment, a gate terminal of the eleventh TFT NT11 is electrically connected to the output terminal of the pull-down control module 103, a source terminal of the eleventh TFT NT11 receives the low potential signal VGL, and a drain terminal of the eleventh TFT NT11 is electrically connected to the output terminal G(n) of the nth GOA driving unit stage. Wherein, the pull-down output module is turned off by the low potential signal generated from the pull-down control module when power is turned off, so that the low potential signal is not output to the output terminal of the nth GOA driving unit stage from the pull-down output module.

Specifically, when power is turned off, the source terminal of the eleventh TFT NT11 receives the low potential signal and the gate terminal of the eleventh TFT NT11 is electrically connected to the output terminal of the pull-down control module 103. Because the pull-down control module 103 outputs the low potential signal, the eleventh TFT NT11 is turned off so that the drain terminal of the eleventh TFT NT11 does not output the low potential signal to the output terminal G(n) of the nth GOA driving unit stage.

As shown in FIG. 2, the reference numeral 105 indicates the diagram showing connections of the first global control module. The first global control module 105 comprises the fourteenth TFT NT14.

In one embodiment, a gate terminal and a source terminal of the fourteenth TFT NT14 receive the first global control signal GAS1, and a drain terminal of the fourteenth TFT NT14 is electrically connected to the output terminal G(n) of the nth GOA driving unit stage. Wherein, the first global control module is configured to output the high potential signal to the output terminal of the nth GOA driving unit stage when power is turned off.

Specifically, when power is turned off, the first global control signal GAS1 is turned into the high potential signal. Because the gate terminal and the source terminal of the fourteenth TFT NT14 both receives the first global control signal GAS1, the fourteenth TFT NT14 is turned on so that the drain terminal of the fourteenth TFT NT14 outputs the high potential signal to the output terminal G(n) of the nth GOA driving unit stage.

As shown in FIG. 2, the reference numeral 106 indicates the diagram showing connections of the reset module. The reset module 106 comprises the thirteenth TFT NT13.

In one embodiment, a gate terminal and a source terminal of the thirteenth TFT NT13 receives the reset signal Reset, and a drain terminal of the thirteenth TFT NT13 is electrically connected to the output terminal of the pull-down control module 103. Wherein, the reset module is configured to control to output the low potential signal from the output terminal of the pull-down control module.

Specifically, when power is turned off, the reset signal Reset is turned into the low potential signal. Because the gate terminal and the source terminal of the thirteenth TFT NT13 both receive the reset signal Reset, the thirteenth TFT NT13 is turned off so that the drain terminal of the thirteenth TFT NT13 does not output the high potential signal to the output terminal of the pull-down control module 103.

As shown in FIG. 2, the reference numeral 107 indicates the diagram showing connections of the second global control module. The second global control module 107 comprises the fifteenth TFT NT15.

In the embodiment, a gate terminal of the fifteenth TFT NT15 receives a second global control signal GAS2, a source terminal of the fifteenth TFT NT15 receives the low potential signal VGL, and a drain terminal of the fifteenth TFT NT15 is electrically connected to the output terminal G(n) of the nth GOA driving unit stage. Wherein, the second global control module controls to output the high potential signal from the output terminal of the nth GOA driving unit stage when power is turned off.

Specifically, when power is turned off, the second global control signal GAS2 is turned into the low potential signal. Because the gate terminal of the fifteenth TFT T15 receives the second global control signal GAS2 and the source terminal of the fifteenth TFT T15 receives the low potential signal, the fifteenth TFT T15 is turned off so that the drain terminal of the fifteenth TFT T15 does not output the high potential signal to the output terminal G(n) of the nth GOA driving unit stage.

Selectively, the GOA driving unit can further comprise a first capacitor C1 and a second capacitor C2. Wherein, a first terminal of the first capacitor C1 is electrically connected to the source terminal of the seventh TFT NT7, and a second terminal of the first capacitor C1 receives the low potential signal VGL; and a first terminal of the second capacitor C2 is electrically connected to the output terminal of the pull-down control module 103, and a second terminal of the second capacitor 02 receives the low potential signal VGL. Wherein, when power is turned off, the first capacitor is configured to keep a potential at the source terminal of the seventh TFT and the second capacitor is configured to keep a potential at the output terminal of the pull-down control module.

It is noted that, as shown in FIG. 2, there are the output signal G(n−2) output from the (n−2)th GOA driving unit stage, the output signal G(n) output from the nth GOA driving unit stage and the output signal G(n+2) output from the (n+2)th GOA driving unit stage in the circuit of the GOA driving unit. It can be understood that the GOA driving circuit can be formed through the connecting relationships between these stages. For example, the gate terminal of the first TFT NT1 of the third driving unit stage is electrically connected to the output terminal G(1) of the first driving unit stage, and the gate terminal of the second TFT NT2 of the third driving unit stage is electrically connected to the output terminal G(5) of the fifth driving unit stage. Furthermore, because the gate terminals of the first TFT's NT1 of the first and second driving unit stages cannot be connected to the output terminals of a driving unit stage non-existed, the gate terminals of the first TFT's NT1 of the first and second driving unit stages receive a starting signal STV. In addition, because the gate terminals of the second TFT's NT2 of the last and penultimate driving unit stages cannot be connected to the output terminals of a driving unit stage non-existed, the gate terminals of the second TFT's NT2 of the last and penultimate driving unit stages are also receive the starting signal STV.

Figure 3:
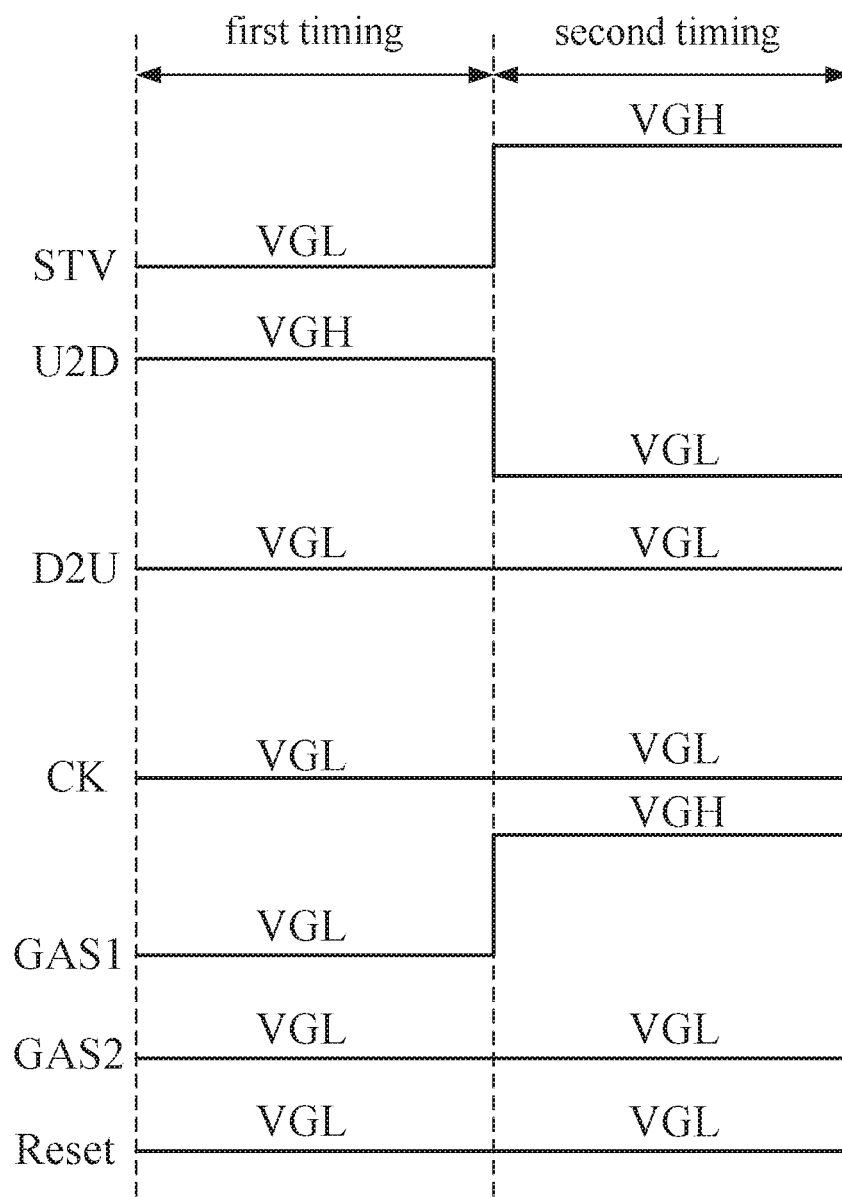
FIG. 3 is a timing diagram of the GOA driving circuit according to the disclosure.

As shown in FIG. 3, which is a timing diagram, the first timing shows the potentials of the input signals of the GOA driving circuit at a time point when the liquid crystal screen functions normally, and the second timing shows the potentials of the input signals of the GOA driving circuit at a time point when power of the liquid crystal screen is turned off. It can be found that, when power is turned off, the starting signal STV and the first global control signal GAS1 are changed to be at high potential and the forward scan signal U2D, the reverse scan signal D2U, the clock signal CK, the second global control signal GAS2 and the reset signal Reset are changed to be at low potential, so that each GOA driving unit stage of the GOA driving circuit is controlled to output the high potential signal to achieve all gate on function.

It can be found that each GOA driving unit stage of the GOA driving circuit in the embodiments of the present disclosure comprises a pull-up control module, a pull-down control module, a pull-up output module, a pull-down output module, a first global control module, a second global control module and a reset module. When power is turned off, the pull-up control module generates the low potential signal to turn off the pull-up output module so that the output of the pull-up output module does not affect the output terminal of the GOA driving unit; the pull-down control module and the reset module generate the low potential signal to turn off the pull-down output module so that the output of the pull-down output module does not affect the output terminal of the GOA driving unit; the first global control module and the second global control module controls to output the high potential signal. By performing the embodiments of the present disclosure, image on the liquid crystal screen can be quickly cleaned when power of the liquid crystal screen is suddenly turned-off, residual image is prevented from being remained on the screen, and visual experience is benefit therefrom.

In the foregoing embodiments, the description of each embodiment has its own emphasis. For the parts that are not described in detail in one embodiment, reference may be made to related descriptions in other embodiments.

Specific examples are used herein to describe the principle and implementation solutions of the present disclosure. The description of the foregoing embodiments is merely used to help understand the method and core idea of the present disclosure. Meanwhile, for those skilled in the art, according to the present invention, the specific implementation solutions and the scope of application can be changed. In summary, the content of the disclosure should not be construed as a limitation on the present invention.

What is claimed is:

1. A gate driver on array (GOA) driving circuit, wherein the GOA driving circuit comprises a plurality of GOA driving unit stages; wherein, a nth GOA driving unit stage comprises: a pull-up control module, a pull-up output module, a pull-down control module, a pull-down output module, a first global control module, a reset module and a second global control module;
    the pull-up control module is configured to generate a first control signal when power is turned off;
    the pull-up output module is configured to stop outputting a clock signal to an output terminal of the nth GOA driving unit stage under control of the first control signal;
    the pull-down control module is configured to generate a second control signal when power is turned off;
    the pull-down output module is configured to stop outputting a low potential signal to the output terminal of the nth GOA driving unit stage under control of the second control signal;
    the first global control module is configured to output a high potential signal to the output terminal of the nth GOA driving unit stage when power is turned off;
    the reset module is configured to stop outputting a reset signal to an output terminal of the pull-down control module when power is turned off;
    the second global control module is configured to stop outputting the low potential signal to the output terminal of the nth GOA driving unit stage when power is turned off.

2. The GOA driving circuit according to claim 1, wherein the pull-up control module comprises a first thin film transistor (TFT), a second TFT, a fifth TFT and a seventh TFT;
    wherein, a gate terminal of the first TFT receives an output signal of a (n−2)th GOA driving unit stage, a source terminal of the first TFT receives a forward scan signal, and a drain terminal of the first TFT is electrically connected to a source terminal of the seventh TFT;
    a gate terminal of the second TFT receives an output signal of a (n+2)th GOA driving unit stage, a source terminal of the second TFT receives a reverse scan signal, and a drain terminal of the second TFT is electrically connected to the source terminal of the seventh TFT;
    a gate terminal of the fifth TFT is electrically connected to the output terminal of the pull-down control module, a source terminal of the fifth TFT receives the low potential signal, and a drain terminal of the fifth TFT is electrically connected to the source terminal of the seventh TFT;
    a gate terminal of the seventh TFT receives the high potential signal, and a drain terminal of the seventh TFT is electrically connected to an output terminal of the pull-up control module;
    wherein, the pull-up control module is configured to generate the first control signal, which is the low potential signal, to turn off the pull-up output module when the power is turned off.

3. The GOA driving circuit according to claim 2, wherein the pull-up output module comprises: a tenth TFT;
    wherein, a gate of the tenth TFT is electrically connected to the output terminal of the pull-up control module, a source terminal of the tenth TFT receives a nth stage clock signal, and a drain terminal of the tenth TFT is electrically connected to the output terminal of the nth GOA driving unit stage;
    wherein, the pull-up output module is turned off by the low potential signal generated from the pull-up control module when power is turned off, so that the low potential signal is not output to the output terminal of the nth GOA driving unit stage from the pull-up output module.

4. The GOA driving circuit according to claim 3, wherein the pull-down control module comprises: a third TFT, a fourth TFT, a sixth TFT, an eighth TFT, a ninth TFT and a twelfth TFT;
    wherein, a gate terminal and a source terminal of the third TFT receive a (n+1)th stage clock signal, and a drain terminal of the third TFT is electrically connected to a source terminal of the eighth TFT;
    a source terminal and a gate terminal of the fourth TFT receives a (n−1)th stage clock signal, and a drain terminal of the fourth TFT is electrically connected to a source terminal of the ninth TFT;
    a gate terminal of the sixth TFT is electrically connected to the source terminal of the seventh TFT, a source terminal of the sixth TFT receives the low potential signal, and a drain terminal of the sixth TFT is electrically connected to the output terminal of the pull-down control module;
    a gate terminal of the eighth TFT receives the forward scan signal, and a drain terminal of the eighth TFT is electrically connected to the output terminal of the pull-down control module;
    a gate terminal of the ninth TFT receives the reverse scan signal, and a drain terminal of the ninth TFT is electrically connected to the output terminal of the pull-down control module;
    a gate terminal of the twelfth TFT receives a first global control signal, a source terminal of the twelfth TFT receives the low potential signal, and a drain terminal of the twelfth TFT is electrically connected to the output terminal of the pull-down control module;
    wherein, the pull-down control module is configured to generate the second control signal, which is the low potential signal, to turn off the pull-down output module when the power is turned off.

5. The GOA driving circuit according to claim 4, wherein the pull-down output module comprises; an eleventh TFT;
    wherein, a gate terminal of the eleventh TFT is electrically connected to the output terminal of the pull-down control module, a source terminal of the eleventh TFT receives the low potential signal, and a drain terminal of the eleventh TFT is electrically connected to the output terminal of the nth GOA driving unit stage;
    wherein, the pull-down output module is turned off by the low potential signal generated from the pull-down control module when power is turned off, so that the low potential signal is not output to the output terminal of the nth GOA driving unit stage from the pull-down output module.

6. The GOA driving circuit according to claim 5, wherein the first global control module comprises: a fourteenth TFT;
   wherein, a gate terminal and a source terminal of the fourteenth TFT receive the first global control signal, and a drain terminal of the fourteenth TFT is electrically connected to the output terminal of the nth GOA driving unit stage;
   wherein, the first global control module outputs the high potential signal to the output terminal of the nth GOA driving unit stage when power is turned off.

7. The GOA driving circuit according to claim 6, wherein the reset module comprises: a thirteenth TFT;
   wherein, a gate terminal and a source terminal of the thirteenth TFT receives the reset signal, and a drain terminal of the thirteenth TFT is electrically connected to the output terminal of the pull-down control module;
   wherein, the reset module is configured to control to output the low potential signal from the output terminal of the pull-down control module.

8. The GOA driving circuit according to claim 7, wherein the second global control module comprises: a fifteenth TFT;
   wherein, a gate terminal of the fifteenth TFT receives a second global control signal, a source terminal of the fifteenth TFT receives the low potential signal, and a drain terminal of the fifteenth TFT is electrically connected to the output terminal of the nth GOA driving unit stage;
   wherein, the second global control module controls to output the high potential signal from the output terminal of the nth GOA driving unit stage when power is turned off.

9. The GOA driving circuit according to claim 8, wherein the nth GOA driving unit stage further comprises a first capacitor and a second capacitor;
   wherein, a first terminal of the first capacitor is electrically connected to the source terminal of the seventh TFT, and a second terminal of the first capacitor receives the low potential signal; a first terminal of the second capacitor is electrically connected to the output terminal of the pull-down control module, and a second terminal of the second capacitor receives the low potential signal;
   wherein, when power is turned off, the first capacitor is configured to keep a potential at the source terminal of the seventh TFT and the second capacitor is configured to keep a potential at the output terminal of the pull-down control module.

10. The GOA driving circuit according to claim 8, wherein, in a first GOA driving unit stage and a second GOA driving unit, the gate terminal of the first TFT receives a starting signal; and, in a last GOA driving unit stage and a penultimate GOA driving unit stage, the gate terminal of the second TFT receives the starting signal; wherein the starting signal is the high potential signal.

* * * * *